(12) United States Patent
Zimmerman et al.

(10) Patent No.: US 6,218,843 B1
(45) Date of Patent: Apr. 17, 2001

(54) ZERO GRAVITY SIMULATOR FOR TESTING BATTERY CELLS

(75) Inventors: Albert H. Zimmerman, Torrance; Alonzo Prater, Carson; Dennis A. Smith, Glendora; James H. Matsumoto, Los Angeles, all of CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 09/602,248

(22) Filed: Jun. 23, 2000

(51) Int. Cl.[7] .................................................. G01N 27/416
(52) U.S. Cl. .............................................................. 324/426
(58) Field of Search .................................... 320/107, 112; 324/426, 432

(56) References Cited

U.S. PATENT DOCUMENTS 5,379,657 * 1/1995 Hasselman et al. .

* cited by examiner

Primary Examiner—Edward H. Tso
(74) Attorney, Agent, or Firm—Derrick Michael Reid

(57) ABSTRACT

A zero gravity simulator rotates an electrolytic device, such as nickel hydrogen battery cells, to simulate the effect of zero gravity on the battery cells by providing a cumulative zero gravity vector upon the device under test. The simulator has electrical connections to the device under test for monitoring the electrical performance of the device for determining the expected performance of the device under test when deployed and used in space.

5 Claims, 2 Drawing Sheets

ZERO GRAVITY SIMULATOR

NICKEL HYDROGEN BATTERY CELL

STACK CORE

ZERO GRAVITY SIMULATOR FOR TESTING BATTERY CELLS

STATEMENT OF GOVERNMENT INTEREST

The invention was made with Government support under contract No. F04701-93-C-0094 by the Department of the Air Force. The Government has certain rights in the invention.

FIELD OF THE INVENTION

The invention relates to the field of battery testing. More particularly the present invention relates to the testing of electrolytic battery cells used in zero gravity space environments.

BACKGROUND OF THE INVENTION

Nickel hydrogen and sealed nickel cadmium batteries have been used in spacecraft applications and have been designed to operate in an electrolyte starved configuration where there is no free liquid electrolyte within the cell. All of the electrolyte is contained by capillary forces within the pores of the electrodes, wall wick, and separators within the cell. This starved configuration simultaneously enables uniform transport of both gases and liquid electrolyte within the electrode stack and in the gas spaces surrounding the electrochemical components within the cell. An excessively starved cell will perform poorly because the separators having large pores will become dry, making the cell unable to support high rates of ionic current flow through the separators.

At the other design extreme, an excessively flooded configuration will not allow uniform transport of gases within the cell. For nickel hydrogen cells, the flooded configuration can result in two problems with gas transport. The first problem occurs when some areas of the hydrophobic side of the negative plates become flooded with electrolyte to limit the accessibility of hydrogen gas to the platinum catalyst in the negative electrode. The second problem occurs when free electrolyte is present in the regions through which oxygen must flow as the oxygen escapes the electrode stack during overcharge. Bubbles of high-pressure oxygen can accumulate in such regions of free electrolyte. These bubbles of oxygen, when contacting the platinum catalyst, can ignite to cause small explosive thermal popping events. Such popping events can occur either over the surface of the negative electrode, or at the edges of the negative electrodes where large amounts of oxygen can be channeled to the edges of the negatives. In the back-to-back stack design of large nickel hydrogen cells, popping at the edges of the plates is generally the more significant. Significant popping events can result in cell short circuits as a result of damage to the edges of the plates or separators.

Ground life-test cycling of nickel hydrogen cell designs can be very misleading in identifying popping problems during prospective spacecraft usage as a result of excessive electrolyte. Cells are typically tested in a vertical configuration that gravitationally drains all free electrolyte into a pool in the bottom of the cell case. Alternatively, testing cells on their sides has been found to also not represent the zero-gravity environment of space because the electrolyte tends to settle towards the downwards side of the electrode stack. Horizontal life testing has often led to early failures due to popping problems, although horizontal life testing also represents a worst-case stress condition for popping problems. Popping damage can lead to short circuits and failures of the battery cells. These and other disadvantages are solved or reduced using the invention.

SUMMARY OF THE INVENTION

An object of the invention is to simulate the distribution of electrolyte in a nickel hydrogen cell operated in the zero-gravity environment of space.

Another object of the invention is to test nickel hydrogen battery cells containing different levels of electrolyte for susceptibility to popping damage during electrical cycling.

Another object of the invention is to provide a test system that simulates zero-gravity during cell operation with electrical charging cycling and monitoring to detect popping events during operation.

The present invention is directed to simulating zero-gravity during the operation of devices, such as battery cells, which contain both fluids and gases that can redistribute to affect performance in the presence of the gravitational field of the earth. The simulation of zero gravity leads to ground test results that are equated to performance expectation of the cells operating in a spacecraft in space. The test results are particularly useful in predicting the performance of nickel hydrogen battery cells that depend on controlled movement of both gas and liquid electrolyte for proper performance. The system provides simulated zero-gravity performance at a small fraction of the cost and time required carrying out a space experiment. The system simulates zero-gravity by time-averaging the gravitational field of the earth to zero on a time scale consistent with the rate of movement of fluids within the device. This test is done rotating the device under test in a rotating test fixture for a simulated zero-gravity life test for electrolytic battery cells, such as nickel hydrogen battery cells, containing differing levels of liquid electrolyte. The system provides simulated results consistent with the performance of these battery cells when in space. The system can rotate large battery cells that are horizontally positioned and then rotated at a predetermined rate, such as at one revolution every minute, which rotational rate is consistent with the rate at which electrolyte moves through the electrode stack within these nickel hydrogen battery cells. The system can be operated continuously for many months within an environmentally controlled chamber at a controlled temperature. The system can effectively provide for any constant or variable temperature profile within a range of temperatures. The system has the ability to simulate the zero gravity environment of space quickly and cheaply for a wide range of devices containing materials or fluids that respond to gravitational forces on time scales of seconds to minutes. The system can detect failure events and can be used to model the expected performance of the battery cells operated in space. These and other advantages will become more apparent from the following detailed description of the preferred embodiment.

DETAILED DESCRIPTION OF THE PREFERRED EMBODIMENT

Figure 1:
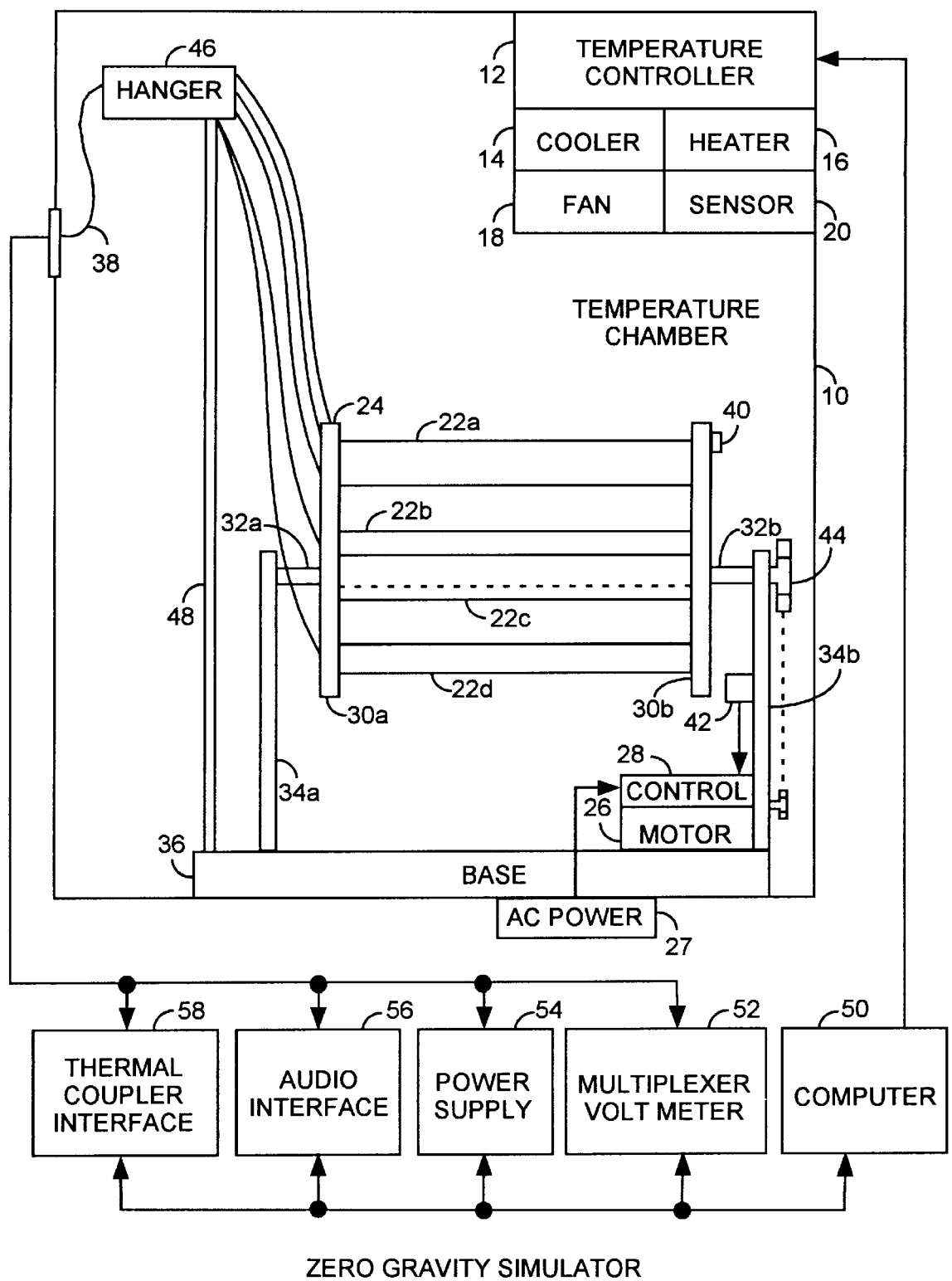
FIG. 1 is a block diagram of a zero gravity simulator.

An embodiment of the invention is described with reference to the figures using reference designations as shown in the figures. Referring to FIG. 1, a zero gravity simulator includes a temperature chamber 10 having a temperature controller 12, cooler 14, heater 16, fan 18 and temperature sensor 20 for controlling and monitoring the temperature within the chamber 10. A plurality of battery cells 22a, 22b, 22c, and 22d are affixed to a rotator 24 that is rotated by an AC motor 26. AC power 27 is distributed to a control unit 28 for controlling the motor 26 for rotating for rotator 24 at a predetermined number of revolutions per minute rate. The rotator 24 is rotated about a horizontal axis relative to earth gravity. The rotator 24 includes two end plates 30a and 30b respectively attached to left and right axle portions 32a and 32b, that in turn rotate within and are supported by left and right stand portions 34a and 34b, respectively. The left and right stand portions 34a and 34b are supported by a base 36 within the temperature chamber 10. Electrical power and monitoring wires 38 are connected to each of the battery cells 22abcd. As shown, four battery cells 22abcd are supported in the rotator 24. The rotator 24 is rotated at a predetermined rate. A tab 40 and tab sensor 42 are used to monitor and control the rotational rate. The rotator 24 is rotated using a drive chain 44 coupling the rotator 24 to the AC motor 26. A hanger 46 is supported by a hanger stand 48 and is used to support the wires 38 connected to a data acquisition system including a computer 50, multiplexer voltmeter 52, power supply 54, audio interface 56 and thermal coupler interface 58. The data acquisition system controls and monitors the battery cells 22abcd during testing.

Figure 2:
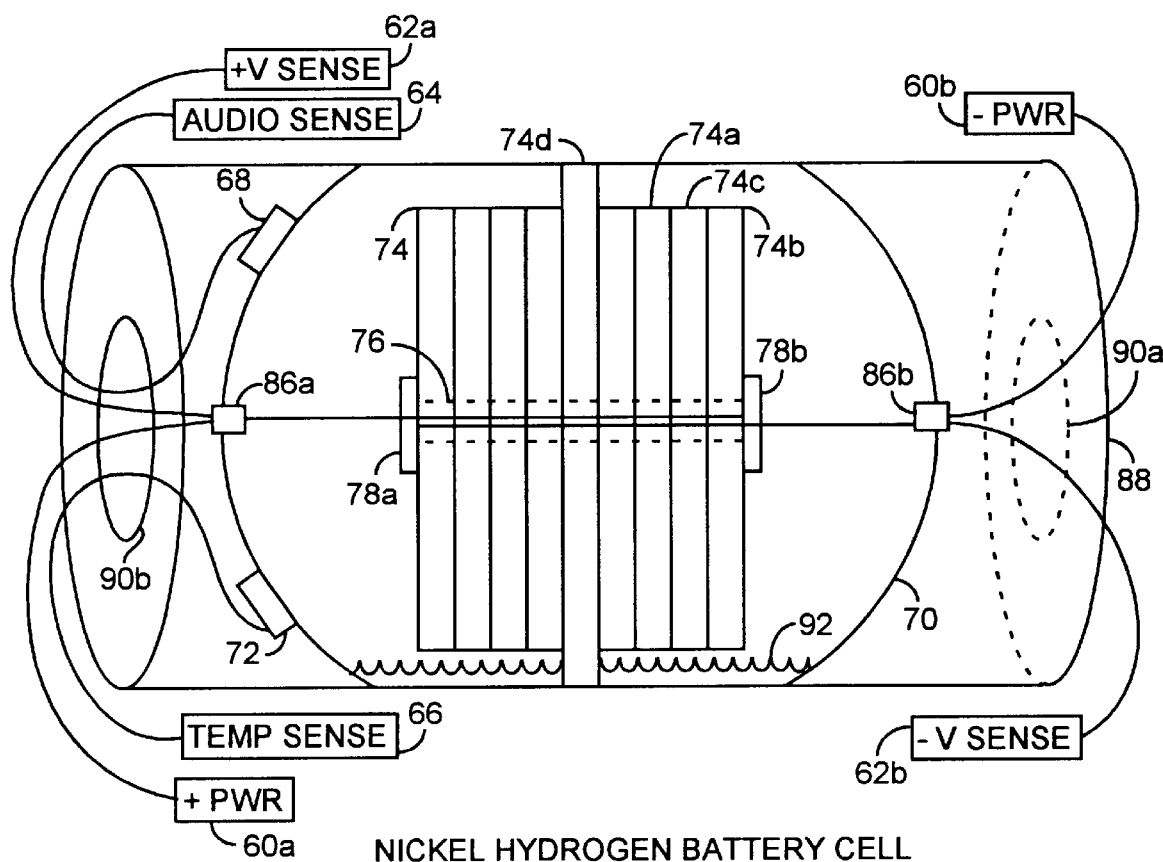
FIG. 2 depicts a stack of nickel hydrogen battery cells disposed in a rotating structure.
Figure 3:
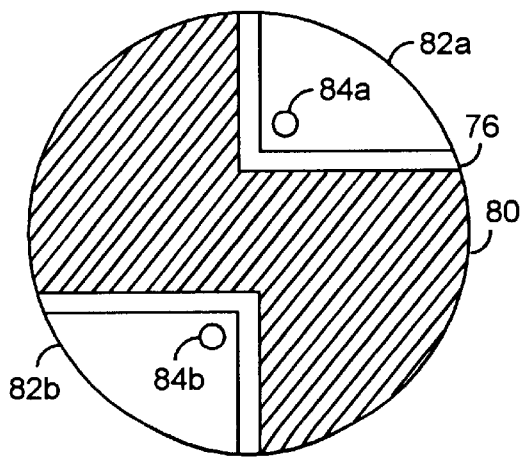
FIG. 3 depicts the core within a battery cell stack.

Referring to all of the figures, and more particularly to FIGS. 2 and 3, the wires 38 include +/− power lines 60a and 60b, respectively, +/− voltage sense lines 62a and 62b, respectively, an audio sense line 64 and a temperature sense line 66. The +/− power lines 60ab provide power to the battery cell 22 and the +/− voltage sense lines 62ab provide sensing voltages of the battery cell 22. The audio sense line 64 is connected to an audio sensor 68 attached to a battery cell pressure vessel 70 for sensing audio popping sounds within the battery cell 22. The temperature sense line 66 is connected to a thermocouple 72 that is also attached to the battery cell pressure vessel 70 for sensing the temperature of the battery cell 22. The battery cell 22 is constructed as a stack of discs 74. The discs 74 include alternating anode and cathode metal electrodes disc 74a and 74b, and separator disc 74c. The insulating circular disc shaped separator 74c is disposed between each pair of electrodes 74a and 74b. A center weld disc 74d is disposed in the center of the stack of discs 74. The electrodes 74ab, separators 74c and weld plate 74d are circumferentially aligned as the stack 74 within the pressure vessel 70 around a stack core 76. The discs 74 are abutted together around the stack core 76 using end caps 78a and 78b. The stack core 76 has a center grooved rod 80, that is mated to protruding contacts 82a and 82b of the alternating electrodes 74a and 74b extending inwardly into the stack core 76. The stack core 76 serves to align the circular shaped battery electrodes 74ab, separators 74c and weld plate 74c along the length of the pressure vessel 70. The +/− power lines 60ab are routed through sealed openings 86a and 86b to the electrodes 74ab using spotwelded contact points 84a and 84b disposed within the contacts 82a and 82b, respectively within grooves of the stack core rod 80. The cathode and anode electrodes 74ab of the battery cell 22 are electrically connected together using the +/− power lines 60ab. The center weld plated 74d is affixed to the temperature pressure vessel 70. The center weld plate 70 has a diameter of the pressure vessel 70. The electrode discs 74ab and separators 74c have a diameter less than the weld plate 74d so that the weld plate 74d serves to suspend and electrically isolate the electrodes 74ab within the pressure vessel 70. The weld plate 74d is affixed to the stack core 76 between two sets of battery electrodes and serves to rigidly suspend the stack of battery electrodes 74ab within the pressure vessel 70. The pressure vessel 70 is a hydrogen gas reservoir. The oval shaped, but substantially cylindrical pressure vessel 70 is rigidly affixed to and disposed within a cylindrical temperature coffin 88 having openings 90a and 90b for communicating wires 60ab, 62ab, 64 and 66. The coffin 88 provides thermal heat coupling to the battery electrodes 74ab during testing. Lastly, the electrolyte 92 is disposed in a predetermined quantity within the pressure vessel 70. The battery cell 22 is of a conventional pressure vessel design, but other types of electrolytic battery cells may be tested.

In operation, the zero gravity simulator is used to evaluate the upper threshold for electrolyte fill quantity in the cell design, that may be a 350 Ah cell design. The fill quantity is consistent with minimal risk of cell short circuits due to popping damage. During testing, electrolyte fill quantities are preferably correlated to temperature cycling and popping damage.

An initial electrolyte fill amount is the amount added at cell activation. The initial fill level tends to leave a pool of free electrolyte of about 100 cc in the pressure vessel 70. A final fill amount is the amount remaining in the stack after all free electrolyte is drained. The system for simulating zero-gravity is to time average the gravitational field vector to zero within each cell. This test effectively simulates the zero-gravity environment in terms of producing no gravitational orientationally preferred region in which free electrolyte may pool. During testing, the cells 22 are continuously rotated while held in a horizontal position with the discs 74 being held in a vertical position within the cells 22. The rotation period of the cells can vary, but will typically remain constant during each test. A one minute rotation rate is appropriate for most large nickel hydrogen battery cells. The cells are held in the rotator 24 in the temperature chamber 10 at a suitable temperature, for example, ten degrees Celsius.

Each cell 22abcd is be instrumented using the voltage sensing lines 62ab, the temperature lines line 66 connected to the thermistor 72, and the audio sense line 64 connected to the acoustic pickup 68. The acoustic pickup 68 is monitored by the transient data acquisition system that is periodically triggered to record a transient over a predetermined duration and is used to detect audio frequency popping events. Each transient recording has a predetermined duration, for example, two seconds, with a predetermined number of data points, for example, one thousand data points, that are saved during the transient recording period for each of the signals being monitored. The transient recording occurs at spaced time intervals, for example, at two millisecond intervals. A minimum number of transients, for example, twenty-four transients, are recorded during each charge and discharge cycle, with additional transients being recorded when particularly significant audio frequency events were detected. An average number of about 48 total transients are typically recorded during each charging cycle.

The thermistor 68 is imbedded in an aluminum or carbon composite sleeve, not shown, and disposed in direct contact with the inconel pressure vessel 70. The thermistor 68 may be mounted near the center of the electrode stack 74abcd. A pair of thermistors 72 may be disposed on the vessel 70, one on each side of each cell 22, for improved temperature sensing. The thermistor 72 mounting area may be covered with a one square inch piece of insulating foam, not shown, to isolate the thermistor 72 from the chilled air in the temperature chamber 10. The thermistor 72 detects any thermal transients that could be due to popping events. Such thermal transients are expected to have a duration on the order of seconds.

The four cells are operated for many charge and discharge cycles, for example 200, in the simulated zero-gravity environment over a long, for example twelve hour, electrical cycle to obtain an 80% depth-of-discharge and a 120% charge return. After testing, the cells are subjected to a charge retention test in the zero-gravity environment at 10 degrees C. Following the electrical testing, the cells are disassembled and inspected for signs of degradation or unusual changes. The components are inspected for indications of popping damage that is typically manifested as melted regions of gas screen, holes in the platinum black catalyst on the negative plates, and in severe cases loss of separator and fragmentation of the positive plate structure. During testing, the popping events can be detected by audio frequency measurements and with sufficient data averaging over long-term cycling, a semi-quantitative measure of popping susceptibility for nickel hydrogen cells can be obtained for a given level of electrolyte. From the audio noise analysis, the popping is much more severe in cells that have higher amounts of electrolyte.

The zero-gravity testing causes distribution of electrolyte to be uniform through the length of the stack. The zero-gravity simulation is designed to maintain a uniform distribution in and around the cell stack, while not allowing any excess electrolyte to pool in the domes of the cells. The acoustic sensors detect significantly greater noise levels during overcharge in the two cells that have higher amounts of electrolyte, a result of popping events in these cells. The zero gravity simulator is used to test the operation of the cells and to prevent pooling of the electrolyte. During testing, the cells are charged and discharged and then inspected for damage. Those with damage due to popping are likely to fail when in space at the predetermined level of electrolyte. As such, the zero gravity simulator is used to test battery cells at a predetermined amount of electrolyte, or any device containing a liquid that is intended to be operated in space. Those skilled in the art can make enhancements, improvements, and modifications to the invention, and these enhancements, improvements, and modifications may nonetheless fall within the spirit and scope of the following claims.

What is claimed is:

1. A system for simulating zero gravity, the system comprising, a rotating support that is rotated about a horizontal axis relative to earth gravity, a device containing a liquid that can flow to various regions within the device, and a motor for rotating the rotating support, the rotation being at a predetermined rate, a time average gravitation force upon the devices is zero.

2. The system of claim 1 further including, a monitoring system for monitoring the performance of the devices being tested at a predetermined level of liquid.

3. The system of claim 1 further comprising a temperature chamber for encapsulating and heating the rotating support and the devices.

4. The system of claim 1 wherein, the devices are nickel hydrogen battery cells, the fluid is an electrolyte, and the rotating support rotates the battery cells at a predetermined rate to prevent pooling of the electrolyte.

5. The system of claim 1 wherein the devices are nickel hydrogen battery cells, the fluid is an electrolyte, and the rotating support rotates the battery cells at a predetermined rate to prevent pooling of the electrolyte, the system further comprising a monitoring system for monitoring acoustic sounds emanating from the cells indicative of failing battery operation.

* * * * *